(12) United States Patent
Maurice

(10) Patent No.: US 7,109,725 B2
(45) Date of Patent: Sep. 19, 2006

(54) INTEGRATED CIRCUIT TEST PROBE

(75) Inventor: Olivier Maurice, Yvette (FR)

(73) Assignee: European Aeronautic Defence and Space Company Eads France and Eads CCR Groupement d'Interet Economique, Paris (FR)

( * ) Notice: Subject to any disclaimer, the term of this patent is extended or adjusted under 35 U.S.C. 154(b) by 0 days.

(21) Appl. No.: 11/295,965

(22) Filed: Dec. 7, 2005

(65) Prior Publication Data

US 2006/0132115 A1    Jun. 22, 2006

(30) Foreign Application Priority Data

Dec. 7, 2004    (FR) .................................. 04 52895

(51) Int. Cl.
*G01R 27/04* (2006.01)
(52) U.S. Cl. ...................... 324/637; 324/600; 324/765; 324/72.5
(58) Field of Classification Search ................ 324/637, 324/639, 642, 643, 700
See application file for complete search history.

(56) References Cited

U.S. PATENT DOCUMENTS 6,121,779 A * 9/2000 Schutten et al. ............ 324/627
6,411,105 B1 * 6/2002 Liu ............................. 324/639
2002/0047722 A1 4/2002 Cook et al.

FOREIGN PATENT DOCUMENTS

WO    WO 00/72030 A1    11/2000

\* cited by examiner

*Primary Examiner*—Vincent Q. Nguyen
(74) *Attorney, Agent, or Firm*—Patterson, Thuente, Skaar & Christensen, P.A.

(57) ABSTRACT

A method and apparatus for testing integrated circuits by subjecting the circuits to an electromagnetic disturbance. A probe is provided, equipped with a horn cover designed to be applied to a printed circuit on which an integrated circuit is mounted. Within this horn cover, a core shield channels the electrical field that is deployed in a zone in which connections from the integrated circuit to the printed circuit that it carries are situated. The effectiveness of the electromagnetic interference injected in the integrated circuit is increased to the point that a true measurement of the resistance of this integrated circuit to the electromagnetic interferences may be carried out.

9 Claims, 3 Drawing Sheets

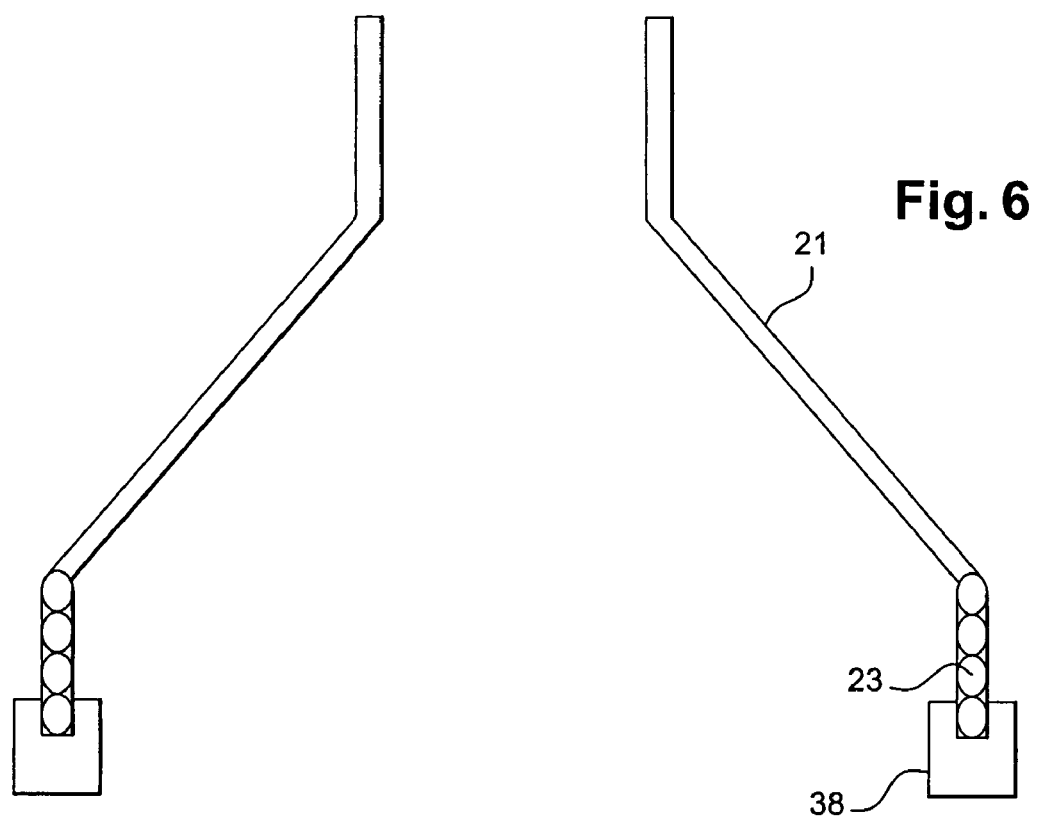

INTEGRATED CIRCUIT TEST PROBE

RELATED APPLICATIONS

The present application claims priority to French Application No. 04 52895 filed Dec. 7, 2004.

TECHNICAL FIELD

The object of the present invention is an integrated circuit test probe used in particular for the electromagnetic compatibility characterization of integrated circuits.

BACKGROUND OF THE INVENTION

Currently known techniques for characterizing the immunity of integrated circuit components are grouped into two main families: direct injection techniques, and radiation injection techniques.

The direct injection techniques are themselves separated into two main types: the DPI (Direct Power Injection) technique, and the BCI (Bulk Current Injection) technique. The DPI technique consists of developing a specific printed circuit for the component, to which the possibilities of injecting a parasite signal may be added. One then monitors if the component is disturbed in the presence of the injected signal. The BCI technique consists of inserting a cable that transports the functional signals from the component, or from a card that has several components, in a transformer. The object of the transformer is to insert electrical power over driving sides of this cable, and in this way verify the interference or the non-interference of the component(s).

The DPI technique has the advantage of fine characterization of the susceptibility of a function of an integrated circuit for localized injection. Its defect is it does not easily allow simultaneous injection over several inputs of a component. Conversely, the BCI technique allows all the accesses of a component to be bombarded simultaneously. But, the BCI technique uses jumper wires of minimal length due to the very fact that the transformer volume does not allow high frequency connection, in practice not above 500 MHz.

Radiation injection techniques utilize TEM (Transverse Electromagnetic Mode), or GTEM (Gigahertz TEM) resonant cells, or even MSC (Mode Stirred Chamber) mode stirred cells, to excite printed circuit type electronic cards that carry components. Or rather, these cells excite the specific cards carrying a component to be tested to verify its subfield susceptibility. In every case, to characterize the susceptibility of a component, these techniques require the manufacture of a particular card, and necessitate, due to the fact of the relative remoteness of the field sources with respect to the components, significant power sources. Furthermore, control of the part of the disturbance power effectively received by the component is not easy, or even debatable.

SUMMARY OF THE INVENTION

Therefore, the object of the invention is to allow an in situ characterization of the susceptibility of an integrated circuit in very high frequencies. The invention comprises in its principle a structure for guiding the disturbance field over a particular small zone around a component such as is present in reality. Therefore, such a component may be tested alone in its own housing or even mounted on the electronic card with which it must be actually used (not a specific test card).

The disturbance field guiding structure of the invention comprises, in an example, an overall conical structure mounted in extension of a coaxial cable, with overall two horns or nested funnels, two cones in a practical example. A metallic central core, in a closed (or full) horn, forms an antenna and a shield at the same time for propagating the radioelectric field issued from the cable. A horn cover, preferably metallic, envelopes this horn shield and channels the field propagated over a zone chosen in advance. The zone chosen in advance is a peripheral zone of the component: where the connections for this component are normally situated. This peripheral zone corresponds to a crown that is present between two horns.

This guiding structure receives the energy from a coaxial cable and directs the energy in a radiated manner to a field near the component. Electrical and magnetic fields are established all around the horn shield and for the electrical field, also between the extremity of the horn shield in the direction of a chip layout that carries the component. These fields are coupled with the pins of the component or soldering tracks and beads (bonding in the case of BGA housings). In addition, the bell cover may be disposed on the two faces of the printed circuit. Its development only possibly requires a low resistance around the component. Preferably, this resistance is achieved with a ground track connected to the ground of the component to be tested. This resistance corresponds to the peripheral zone of contact with the bell cold point. This resistance may be easily included in the final and functional routing of the card including the component. Therefore, the technique allows the susceptibility of a component in its real work environment to be evaluated, by taking into consideration couplings with elements inseparable from the component. Among these inseparable elements appear possible decoupling elements, tracks, housings or other. It is also possible to use a version of the horn cover, insulated at its lower extremity. This version allows a support of this horn cover on the near components in the periphery of the component to be tested. A flexible conductive skirt then presses against these components (decoupling capacitors, quartz, etc.), continuing to confine the field on the zone to be irradiated, but without requiring the manufacture of a specific routing with the ground resistance.

The total power transmitted is measured through a coupler put on line with the power cable of the bell. The advantage of the technique is to not require the obligatory creation of a specific test card, and to take the real conditions of operation of the integrated circuit into consideration. The field is admittedly polarized according to some directions, but the microwave interference of the components, especially based on the detection phenomena, does not take into consideration the relative phase of the injections from one input to another. Rather, it takes the amplitude of the coupled field into account.

The bell shapes may be diverse and adapted to different configurations of printed circuits and layouts.

Therefore the object of the invention is an integrated circuit test probe that is carried by a printed circuit, the probe comprising a radiofrequency signal generator, an antenna, a power circuit for connecting the antenna to the generator, and means for disposing the antenna opposite from the connections situated in the periphery of an integrated circuit to be tested, to cause these radiofrequency signals to be emitted on these connections, characterized in that the antenna comprises a wave guide with a horn cover and a core shield, the horn cover having an opening surface that is larger than a span of a surface of a housing for the integrated circuit to be tested, the core shield having a flaring wherein a sectional surface at the location of its extremity is lower at the surface of a housing of the integrated circuit to be tested, means being provided for placing the horn cover against the printed circuit, and the core shield, within the horn cover, above the component.

In particular the horn shield may be stopped higher in the volume of the horn cover to generate diverse polarization fields or to exploit cavity effects in the volume of the horn cover. In addition, the horns are not necessarily cone-shaped, they may be parallelepiped-shaped.

BRIEF DESCRIPTION of THE DRAWINGS

The invention will be better understood upon reading the following description and examining the accompanying figures. These are presented for indication purposes only and in no way limit the invention. The figures show:

FIGS. 3, 4, 5 and 6 depict construction details of an essential element of the probe of the invention.

DETAILED DESCRIPTION of THE INVENTION

Figure 1:
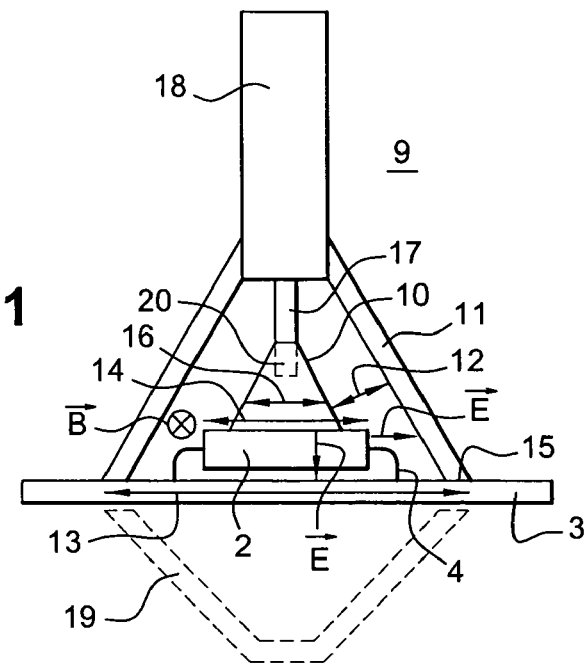
FIG. 1 is a schematic representation of an antenna of a test probe according to the invention.
Figure 2:
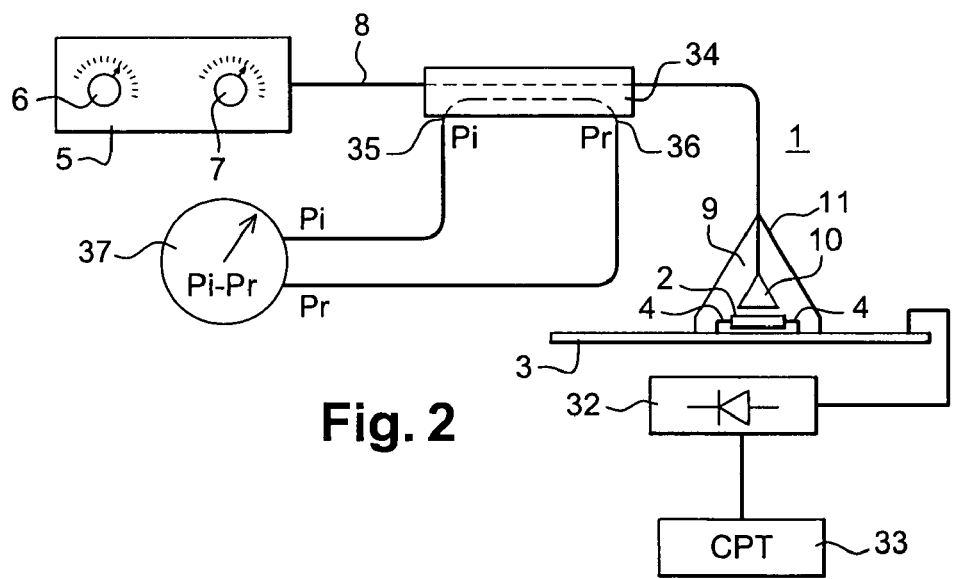
FIG. 2 depicts a device for using the test probe according to the invention.

FIGS. 1 and 2 show a test probe 1 for an integrated circuit 2 according to the invention. FIG. 1 is a view of a particular detail of FIG. 2. An integrated circuit 2 is carried by a printed circuit 3. For example, the integrated circuit 2 is connected to the printed circuit 3 by connections 4 by which it is naturally powered. The printed circuit 3 is preferably a real printed circuit, which is designed to carry the component 3 in its real utilization, particularly an electronic circuit card to be inserted in an apparatus in which this integrated circuit is effective. If necessary, the printed circuit 3 may be a test circuit. However, this is not necessary with the invention. In this case in particular, the invention allows the circuit 2 to be tested under real usage conditions.

The probe 1 comprises a radiofrequency signal generator 5. Preferably, the generator 5 comprises a circuit 6 to regulate the frequency of an emitted signal, as well as a circuit 7 to regulate the amplitude of the signal produced by the generator 5. The generator 5 is connected by a power circuit 8 to an antenna 9. The antenna 9 forms the essential part of the invention. The antenna 9 is shown in greater detail in FIG. 1. The antenna 9 is disposed opposite from the integrated circuit 2 to be tested. The antenna 9 is particularly disposed opposite the connections 4. In a manner that is known, antenna 9 serves to cause the electromagnetic signals to be emitted over the connections 4 as well as in the component 2 and in the printed circuit 3 in such a way as to disturb the operation of the integrated circuit 2, in such a way as to measure the resistance to the disturbances.

According to the invention, the antenna 9 comprises a wave guide capable of emitting an electrical field E and a microwave magnetic field B. In FIG. 1, the electrical field E is shown as orientated, in the effective parts, from a core shield 10 of antenna 9 in the direction of a horn cover 11 of this antenna 9, as well as in the direction of the printed circuit 3 from the core shield 10. The microwave magnetic field B is propagated in the entire space of the guide, and especially at the location of connections 4 that is orientated in the directions perpendicular to these connections. One may show that the wave guide thus formed, propagates in a field near the electrical and magnetic fields on the integrated circuit 2. Consequently, the orientations of these fields are not completely stabilized. The orientation of field B fluctuates in such a way that during a notable proportion of time field B exerts a desired disruptive influence on the connections 4.

The idea of the 'invention is to form, with the core shield 10, a wave guide in such a way that only a space 12 where the connections 4 are situated will be excited by the microwave radioelectric field. The space 12 is the space situated inside the horn cover 11, between this horn cover 11 and the core shield 10. Because of this, the horn cover 11 has an opening surface 13 that is larger than a span 14 of the integrated circuit 3 to be tested and its connections. To the extent that it is possible, one may expect that the horn cover 11 enters into contact with a ground circuit 15 that is peripheral to the component 2 and constructed on the printed circuit 3. However, this layout is not indispensable, it suffices that the horn cover 11 has a larger span than the connections 4 so as they do not touch them.

In return, the core shield 10 has a flaring 16 whose sectional surface at the location of its extremity on the component 2 is less at the span 14 of the surface of a housing of the integrated circuit 2 to be tested.

As much as the horn cover is pinned on the printed circuit 3 the core shield 10 is placed on the component, within the horn cover. The horn cover 11 and the core shield 10 are connected to the power circuit 8. In an example, a power circuit 8 comprises a coaxial cable with a core 17 and an outer ground conductor 18, generally a strap. The core shield 10 is connected to the central conductor 17; the horn cover 11 is connected to the strap 18.

By acting this way, the flaring of the radioelectric field is confined in space 12, particularly that where the connections 4 are situated. If necessary, the horn cover 11 may be completed by a second horn 19 in a shape symmetrical to the first and placed opposite from the printed circuit 3. Doing this transforms, in all cases, the printed circuit 3 equipped with its integrated circuit 2 into a load for the field radiated. As the radiated field is not established in the entire space, but only between the core shield 10 and the horn cover 11, at the location of connections 4 it is even more significant and even more disruptive (which is the desired object) than if the core shield 10 had not been present and if the electrical field had not been installed freely in the space.

To pin the horn cover 11 against the printed circuit 3 at the same time as the core shield 10 on component 2, one may expect that the shield has at its top a hole through which the core 17 of the coaxial cable penetrates in an elastic manner, with a degree of freedom in translation, in such a way as to take into consideration the differences in altitude of the upper surfaces of the components 2 on the printed circuit 3. In practice, during the test, all you may have to do is hold the coaxial cable 17–18 in one's hands above the printed circuit during the measurements to arrive at the result. Otherwise, a complementary handling and support structure is provided.

Of course, the horn cover 11 and the core shield 10 are preferably formed with electrically conductive surfaces. However, it would be possible to construct one or the other, or even both, with permittivity materials very different from air in such a way that the recommended wave guide phenomenon is produced effectively.

Figure 4:
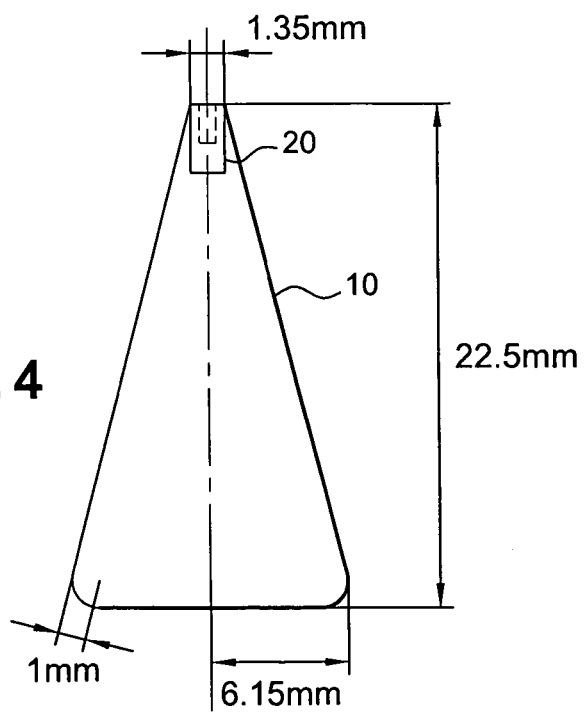

FIG. 4 features a core shield 10 formed by a tile and having a cone shape closed at its base by a metallic surface, continuous with its sides. In this example, the core shield 10 has a circular flaring wherein the diameter is on the order of 12.3 mm. At its top, the core shield 10 also comprises a hole 20, metalized on its walls, allowing a core of a coaxial cable to be introduced and this core to be soldered. In a variation, the core shield 10 is formed of a fully metallic material. If the shield is in a tile, the hole 20 may be blocked or not blocked at its inner extremity by a metallic button.

Figure 3:
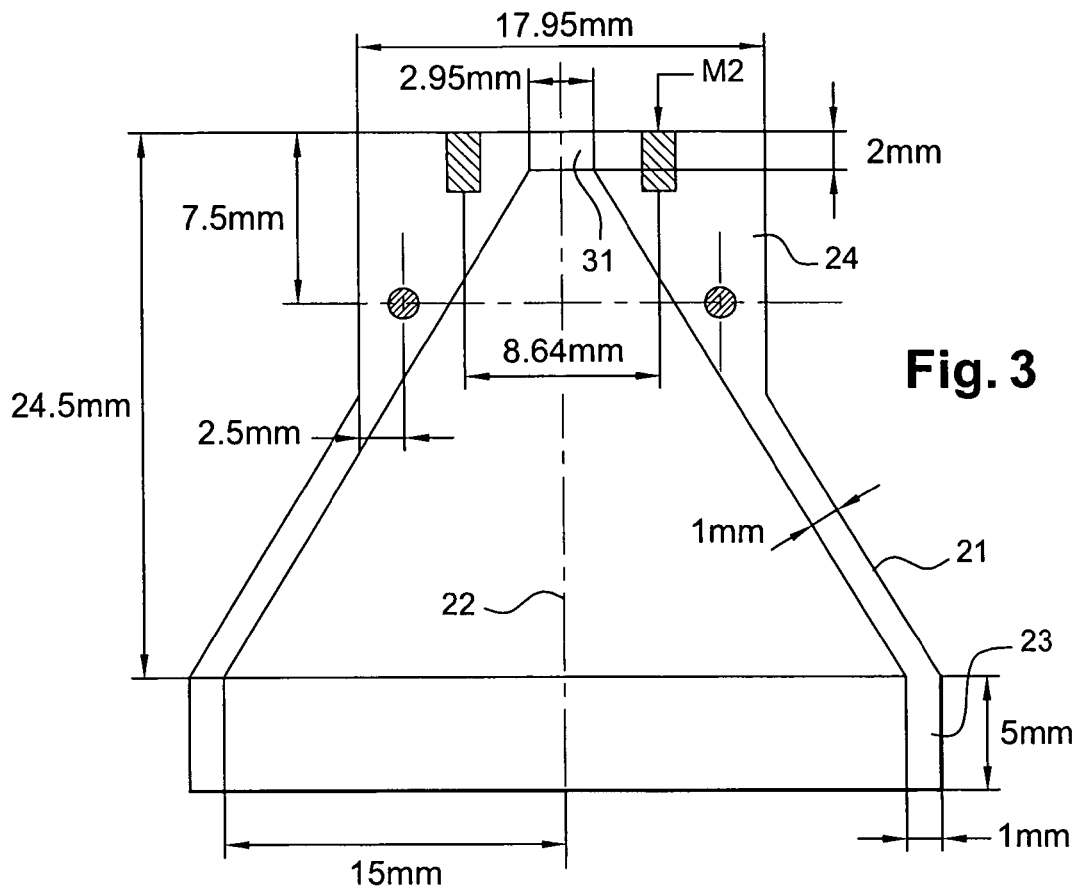

As much as the core shield 10 is preferably made in one piece, the horn cover 11 is preferably formed of two half shells shown in FIG. 3. In an example, these two half shells are constructed by molding or forging. Each half shell comprises a mantle 21 in a half-cone shape centered on the rotation axis 22. The mantle 21 is integral with the base of a skirt 23 in a circular cylindrical shape around the axis 22. The mantle 21 is topped by a massive collar 24 in an exterior cylindrical form and an interior cone form around the axis 22.

Figure 5:
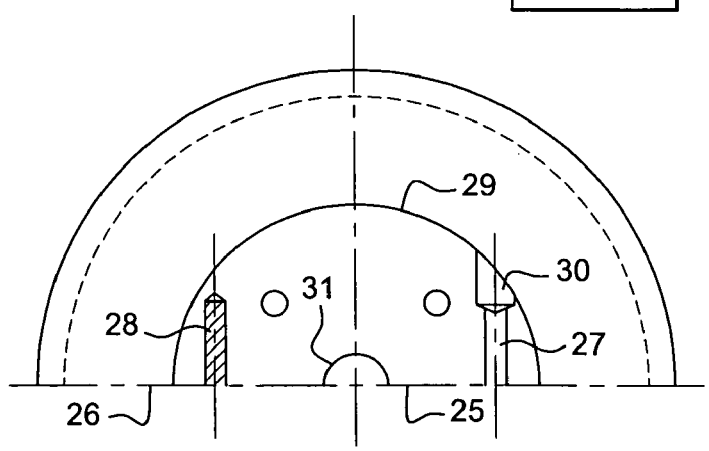

FIG. 5 shows in section each of these half shells presented in FIG. 3. The half shells present plating surfaces 25 and 26 at the location of the massive collar 24. In an example, the surface 25 is pierced by a piercing 27 while the surface 26 is threaded by a non-opening threading 28. However, it may open. The piercing 27 comprises a boring 30 that is larger than the piercing 27 from the cylindrical wall 29 of the collar. This boring 30 allows a head of a screw sliding in the piercing 27 to be maintained and to be screwed in the threading 28 of the other half shell pinned against the faces 25 and 26. The collar 24 also comprises at its top a circular half shell 31 in a half bowl. The half opening 31 is designed to fit tightly around the strap 18 of the coaxial cable that is used to power the probe.

The act of using the half shells allows, for the same size of core shield, different sized and shaped horn covers to be possibly adapted according to the bulkiness or display of an integrated circuit to be tested.

As much as the shapes shown up till now have been cone shapes, it would be possible to adopt shapes with flarings whose base section would not be circular but possibly rectangular, square, or other, according to the shape of the integrated circuits to be tested. Of course, the indications assessed given in FIGS. 3 and 4 may be adapted to the size of the integrated circuits to be tested. The half shells are formed on both sides by a plane passing by the axis 22. The shells are symmetrical with relation to this plane. The half opening 31 is metalized in such a way as to ensure a good contact on the strap 18.

In FIG. 6, in a variation, the skirt 23 is constructed in the form of a deformable and conductive metallic knit. This metallic knit, connected to the metal mantle 21, channels the field. If a ground resistance is not achieved on the printed circuit that carries the integrated circuit to be tested, the lower edge of the knit skirt 23 is equipped with an insulated joint 38, for example in rubber, for example removable. The profile of the joint 38 is U-shaped. The separation of the branches of the U is sufficiently narrow to maintain the joint 38 by elasticity to the base of the skirt on which it is engaged.

The operation of the probe of the invention is as follows. FIG. 1, with the generator 5 and by means of antenna 9, electromagnetic signals are brought to disturb the operation of the integrated circuit 2 put in operation by a command and control circuit 32. This circuit is, for example, a circuit of the type described in document US-B1-6 400 164. The control circuit 32 is, in addition, capable of measuring the lack of response of the integrated circuit 2 during loading of the integrated circuit 2. A counter 33 is used to count the number of failures that are produced in the integrated circuit 2 at the time of these disturbances.

In addition, the power circuit 8 preferably comprises a coupler 34 to 3 dB with two bridging outputs 35 and 36. The output 35 allows the reality of the incident power Pi applied by the antenna 9 over the connections 4 to be measured. The output 36 allows the reflected power Pr to be measured, due to the fact of the lack of adaptation to the impedance characteristic of the load formed by the integrated circuit 2. By acting this way, by subtracting the reflected power from the incident power, one is able to measure the reality of the disturbance power absorbed by the connections 4 and the integrated circuit 2 at the time of the test in a measuring apparatus 37. One may, especially with the help of the measuring apparatus 37, judge the opportunity to place or not place the second horn cover 19 symmetrically with the first horn cover 11 from the other side of the printed circuit 3.

The invention claimed is:

1. A test probe for an integrated circuit that is carried by a printed circuit, the probe comprising a radiofrequency signal generator, an antenna, a power circuit for connecting the antenna to the generator, and means for disposing the antenna opposite from the connections situated in the periphery of an integrated circuit to be tested, to emit (E, B) these radiofrequency signals over these connections, the antenna comprising a wave guide with a horn cover and a core shield, the horn cover having an opening surface that is larger than a span of a surface of a housing of the integrated circuit to be tested, the core shield having a flaring whose sectional surface at the location of its extremity is less at the surface of a housing of the integrated circuit to be tested, means being provided to place the horn cover against the printed circuit, and the core shield, within the horn cover, above the component.

2. The probe according to claim 1, the horn cover and the core shield being formed by electrically conductive surfaces.

3. The probe according to claim 1, the core shield comprising a closed bell or a field guide structure, and a means for connection to an internal conductor of a coaxial cable of the power circuit.

4. The probe according to claims 1, the horn cover being made in two half-shells, symmetrical with relation to each other with relation to a plane passing by a large rotation axis of the horn cover.

5. The probe according to claim 4, each half shell of the horn cover comprising a metalized half bowl to receive an external conductor of a coaxial cable of the power circuit.

6. The probe according to claim 1, the probe comprising a radiofrequency signal generator, adjustable in frequency and in power, a power circuit equipped with a coupler, the coupler used to retrieve a part of a signal transmitted by the power circuit and a part of a signal reflected at the location of the integrated circuit, and a measuring apparatus to measure an effectively absorbed power.

7. The probe according to claim 1, the probe comprising a second horn cover placed symmetrically with relation to the horn cover, from the other side of the printed circuit that carries the component.

8. The probe according to claims 1, the horn cover comprising a metallic knit skirt equipped at its lower edge with a removable insulated joint, for example in rubber.

9. The probe according to claim 1, the horn cover being in contact with a chip layout of the printed circuit or is pressed on the near components of the integrated circuit tested.

* * * * *